US010193959B2

(12) United States Patent
Kazi et al.

(10) Patent No.: US 10,193,959 B2
(45) Date of Patent: Jan. 29, 2019

(54) GRAPHICAL INTERFACE FOR EDITING AN INTERACTIVE DYNAMIC ILLUSTRATION

(71) Applicant: AUTODESK, INC., San Rafael, CA (US)

(72) Inventors: Rubaiat Habib Kazi, Toronto (CA); Tovi Grossman, Toronto (CA); George Fitzmaurice, Toronto (CA); Fanny Chevalier, Lille (FR)

(73) Assignee: AUTODESK, INC., San Rafael, CA (US)

( * ) Notice: Subject to any disclaimer, the term of this patent is extended or adjusted under 35 U.S.C. 154(b) by 207 days.

(21) Appl. No.: 14/745,036

(22) Filed: Jun. 19, 2015

(65) Prior Publication Data

US 2015/0370468 A1 Dec. 24, 2015

Related U.S. Application Data

(60) Provisional application No. 62/014,880, filed on Jun. 20, 2014.

(51) Int. Cl.
| | |
|---|---|
| *G06F 17/00* | (2006.01) |
| *H04L 29/08* | (2006.01) |
| *G06F 3/0484* | (2013.01) |
| *G06F 17/50* | (2006.01) |

(52) U.S. Cl.
CPC ............ *H04L 67/10* (2013.01); *G06F 3/0484* (2013.01); *G06F 3/04842* (2013.01); *G06F 3/04845* (2013.01); *G06F 17/5009* (2013.01)

(58) Field of Classification Search
CPC .................................................. G06F 17/5009
See application file for complete search history.

(56) References Cited

U.S. PATENT DOCUMENTS

| | | | | |
|---|---|---|---|---|
| 2008/0010041 A1* | 1/2008 | McDaniel | ............... | G06F 17/50 703/1 |
| 2008/0233550 A1* | 9/2008 | Solomon | .................. | G09B 9/02 434/276 |
| 2013/0342570 A1* | 12/2013 | Kinnebrew | ............ | G09G 3/003 345/633 |

OTHER PUBLICATIONS

Baecker, R.M. (1969) Picture-Driven Animation. AFIPS Spring Joint Computer Conference, 273-288.

(Continued)

*Primary Examiner* — Andrew T McIntosh
(74) *Attorney, Agent, or Firm* — Artegis Law Group, LLP

(57) ABSTRACT

A computer-implemented method for editing an interactive dynamic illustration includes receiving a first input associated with a functional relationship between a first visual entity in the dynamic illustration and a second visual entity in the dynamic illustration, receiving a second input that associates a visual parameter of the first visual entity with the functional relationship, and receiving a third input that associates a visual parameter of the second visual entity with the functional relationship. The method further includes causing a graphical representation of the functional relationship to be displayed that visually links the first visual entity and the second visual entity. At least one advantage of the disclosed method is that a user can graphically define and/or modify interactive behavior of the visual elements of an interactive dynamic illustration without textually editing the software that generates the illustration.

18 Claims, 14 Drawing Sheets

(56) References Cited

OTHER PUBLICATIONS

Bostock, M., Ogievetsky, V., & Heer, J. (2011). D3 data-driven documents. Visualization and Computer Graphics, IEEE Transactions on, 17(12), 2301-2309.
Davis, R. C., Colwell, B., & Landay, J. A. (2008). K-sketch: a 'kinetic' sketch pad for novice animators. ACM CHI, 113-422.
Fruchterman, T. M., & Reingold, E. M. (1991). Graph drawing by force-directed placement. Software: Practice and experience, 21(11), 1129-1164.
Heer, J., Card, S.K., Landay, J.A. (2005). prefuse: a toolkit for interactive information visualization. ACMCHI, 421-430.
Igarashi, T., Moscovich, T., & Hughes, J. F. (2005). As-rigid-as-possible shape manipulation. ACM Trans. on Graphics 24(3): 1134-1141.
Kazi, R. H., Chevalier, F., Grossman, T., Zhao, S. & Fitzmaurice, G. (2014) Draco: Bringing Life to Illustrations with Kinetic Textures. ACM CHI, 351-360.
Landay, J. A. & Myers, B.A. (2001).Sketching Interfaces: Toward More Human Interface Design. Computer 34 (3):56-64.
LaViola, J. J., & Zeleznik, R. C. (2007). MathPad 2: a system for the creation and exploration of mathematical sketches. Siggraph courses.
Lowe, R. (2003). Animation and learning: selective processing of information in dynamic graphics. Learning and Instruction, 13(2), 157-176.
Miller, T., & Stasko, J. (2001). The Info Canvas: Information conveyance through personalized, expressive art. ACM CHI Extended Abstracts. 305-306.
Mitra, N. J., Yang, Y. L., Yan, D. M., Li, W., & Agrawala, M. (2010). Illustrating how mechanical assemblies work. ACM Trans, on Graphics, 29(4), 58.
Moscovich, T. (2001). Animation sketching: An approach to accessible animation. Master's Thesis, CS Department, Brown University.
Newman, M. W., Lin, J., Hong, J. I., & Landay, J. A.(2003). DENIM: An informal web site design tool inspired by observations of practice. Human-Computer Interaction, 18(3), 259-324.
Ngo, T., Cutrell, D., Dana, J., Donald, B., Loeb, L., & Zhu, S. (2000). Accessible animation and customizable graphics via simplicial configuration modeling. ACM Siggraph, 403-410.
Ramachandran, V.S., & Blakeslee, S. (1998). Phantoms of the brain: Probing the mysteries of the human mind.
Resnick, M., Maloney, J., Monroy-Hernandez, A., Rusk, N., Eastmond, E., Brennan, K., & Kafai, Y. (2009). Scratch: programming.
Roam, D. (2008). The back of the napkin.
Scott, J., & Davis, R. (Oct. 2013). Physink: sketching physical behavior. ACM UIST adjunct. 9-10.
Suwa, M., & Tversky, B. (2002). External representations contribute to the dynamic construction of ideas. Diagrammatic representation and inference. 341-343.
Zhu, B., Iwata, M., Haraguchi, R., Ashihara, T.,Umetani, N., Igarashi, T., & Nakazawa, K. (2011).Sketch-based dynamic illustration of fluid systems.ACM Trans. on Graphics, 30(6), 134.
Lowe, R. (2001), Beyond 'Eye-candy': Improving learning with animations. Apple University Consortium.

\* cited by examiner

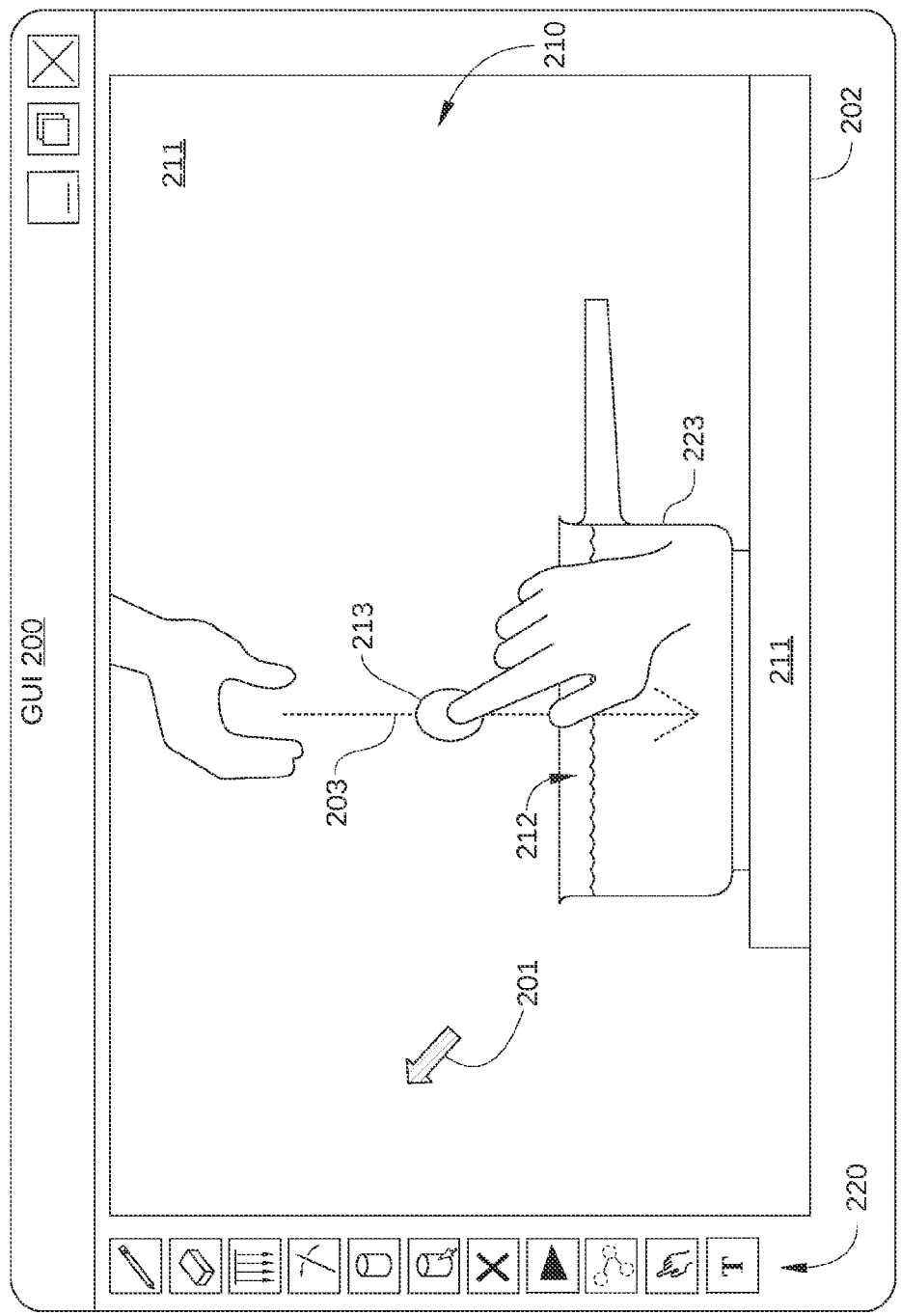

GRAPHICAL INTERFACE FOR EDITING AN INTERACTIVE DYNAMIC ILLUSTRATION

CROSS-REFERENCE TO RELATED APPLICATIONS

This application claims benefit of U.S. Provisional Patent Application filed Jun. 20, 2014 and having Ser. No. 62/014,880. The subject matter of this related application is hereby incorporated herein by reference.

BACKGROUND OF THE INVENTION

Field of the Invention

The present invention relates generally to dynamic illustrations and, more specifically, to a graphical interface for editing an interactive dynamic illustration.

Description of the Related Art

Due to the recent advances in mobile device design and web technologies, there is a growing demand for interactive illustrations to enrich the content found on media such as websites, e-books, and teaching materials. In contrast to static pictures and videos that are consumed by a passive observer, interactive illustrations respond to user inputs, providing a more playful or informative experience for the user. For example, an interactive illustration of a mechanical system invites exploration through interaction as users investigate hypotheses, which may help develop insights about significant relationships and causal patterns associated with the mechanical system.

Typically, crafting interactive illustrations is achieved through programming or scripting, using software platforms such as Java or Flash. Consequently, the artist crafting an illustration is required to work with abstract textual representations of the various visual elements included in the illustration and of any interactive behavior between those visual elements. To obviate the need for such programming skills, researchers and practitioners have developed graphics tools for authoring interactive illustrations that rely on techniques such as drag-and-drop interaction, sketching, and visual programming. While powerful, these tools are tailored for special-purpose applications, for example, fluid flow visualization, and usually do not allow an author to edit interactive behavior between visual objects in an illustration.

As the foregoing illustrates, there is a need in the art for more effective techniques for creating and editing interactive dynamic illustrations.

SUMMARY OF THE INVENTION

One embodiment of the present invention sets forth a computer-implemented method for modifying a interactive dynamic illustration. The method includes receiving a first input associated with a functional relationship between a first visual entity included in the dynamic illustration and a second visual entity included in the dynamic illustration, receiving a second input that correlates a visual parameter associated with the first visual entity with the functional relationship, receiving a third input that correlates a visual parameter associated with the second visual entity with the functional relationship, and based on the first, second, and third inputs, causing a graphical representation of the functional relationship to be displayed, wherein the graphical representation visually links the first visual entity and the second visual entity.

One advantage of the disclosed embodiment is that a user can graphically define and/or modify interactive behavior of the visual elements of an interactive dynamic illustration without textually editing the software that generates the illustration.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2F show how a user can interact with a dynamic illustration via the a graphical user interface of FIG. 1, according to one embodiment of the present invention.

DETAILED DESCRIPTION OF EXEMPLARY EMBODIMENTS

In the following description, numerous specific details are set forth to provide a more thorough understanding of the present invention. However, it will be apparent to one of skill in the art that the present invention may be practiced without one or more of these specific details.

System Overview

Figure 1:
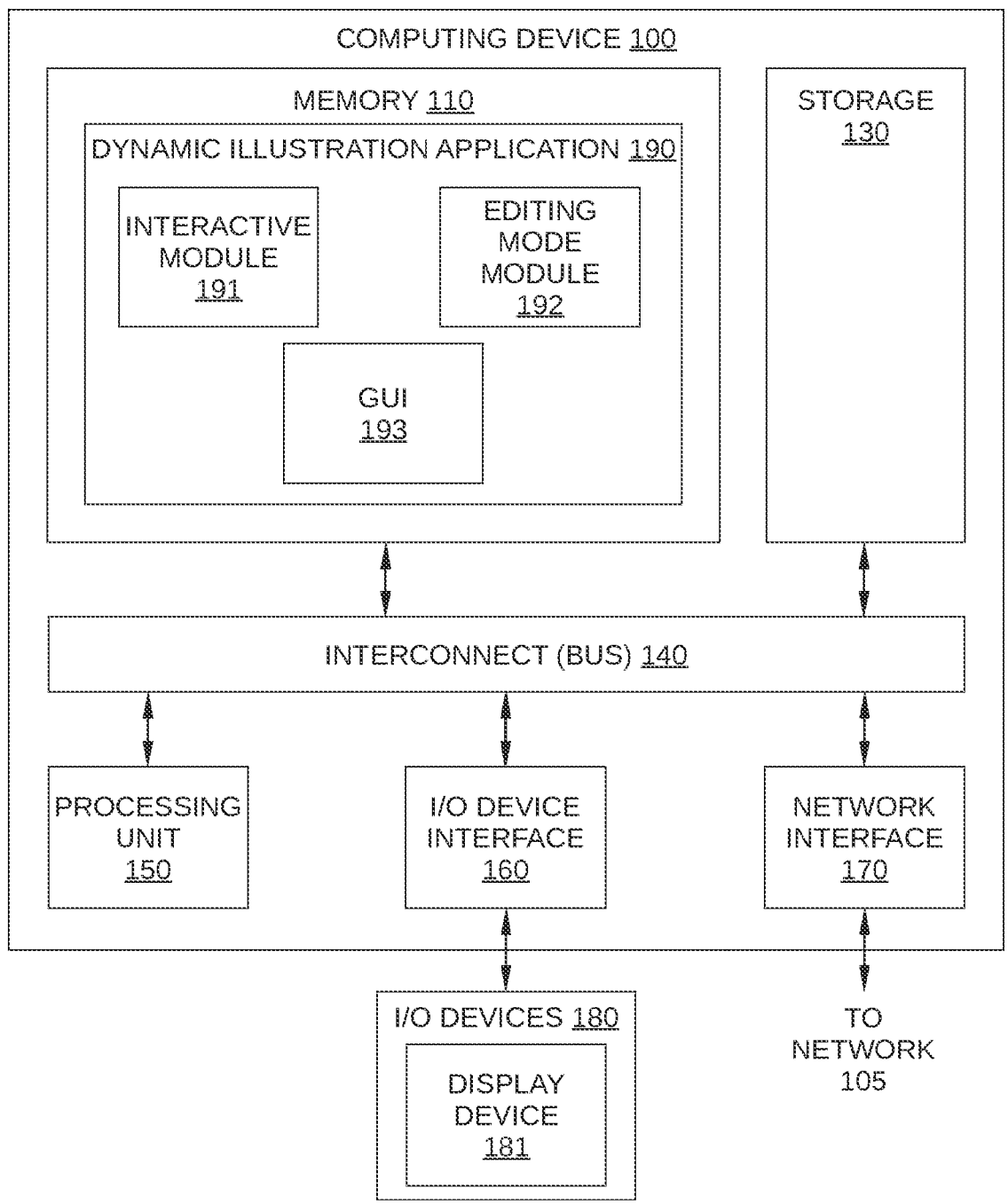
FIG. 1 illustrates a computing device configured to implement one or more aspects of the present invention.

FIG. 1 illustrates a computing device 100 configured to implement one or more aspects of the present invention. Computing device 100 may be a desktop computer, a laptop computer, a smart phone, a personal digital assistant (PDA), video game console, set top console, tablet computer, or any other type of computing device configured to receive input, process data, and display images, and is suitable for practicing one or more embodiments of the present invention. Computing device 100 is configured to run a dynamic illustration application 190, which resides in a memory 110, and is described in detail below. Computing device 100 is further configured to display graphical images and/or videos to the end-user via input/output (I/O) devices 180 (described below). It is noted that the computing device described herein is illustrative and that any other technically feasible configurations fall within the scope of the present invention.

As shown, computing device 100 includes, without limitation, an interconnect (bus) 140 that connects a processing unit 150, an input/output (I/O) device interface 160 coupled to input/output (I/O) devices 180, memory 110, a storage 130, and a network interface 170. Processing unit 150 may be any suitable processor implemented as a central processing unit (CPU), a graphics processing unit (GPU), an application-specific integrated circuit (ASIC), a field programmable gate array (FPGA), any other type of processing unit, or a combination of different processing units, such as a CPU configured to operate in conjunction with a GPU. In general, processing unit 150 may be any technically feasible hardware unit capable of processing data and/or executing software applications, including dynamic illustration application 190. Further, in the context of this disclosure, the computing elements shown in computing device 100 may correspond to a physical computing system (e.g., a system in a data center) or may be a virtual computing instance executing within a computing cloud.

I/O devices 180 may include devices capable of providing input, such as a keyboard, a mouse, a touch-sensitive screen, and so forth, as well as devices capable of providing output, such as a display device 181. Display device 181 may be a computer monitor, a video display screen, a display apparatus incorporated into a hand held device, or any other technically feasible display screen configured to present dynamic or animated media to an end-user. In some embodiments, display device 181 is a terminal window displayed on another display device, such as a video display window that has been opened by dynamic illustration application 190. Additionally, I/O devices 180 may include devices capable of both receiving input and providing output, such as a touchscreen, a universal serial bus (USB) port, and so forth. I/O devices 180 may be configured to receive various types of input from an end-user of computing device 100, and to also provide various types of output to the end-user of computing device 100, such as displayed digital images or digital videos. In some embodiments, one or more of I/O devices 180 are configured to couple computing device 100 to a network 105.

Network 105 may be any technically feasible type of communications network that allows data to be exchanged between computing device 100 and external entities or devices, such as a web server or another networked computing device. For example, network 105 may include a wide area network (WAN), a local area network (LAN), a wireless (WiFi) network, and/or the Internet, among others.

Memory 110 may include a random access memory (RAM) module, a flash memory unit, or any other type of memory unit or combination thereof. Processing unit 150, I/O device interface 160, and network interface 170 are configured to read data from and write data to memory 110. Memory 110 includes various software programs that can be executed by processor 150 and application data associated with said software programs, including dynamic illustration application 190.

Dynamic illustration application 190 is configured to display interactive and/or dynamic illustrations. In addition, dynamic illustration application 190 is configured to enable a user to generate such illustrations without employing textual programming inputs. Specifically, dynamic illustration application 190 allows a user (hereinafter referred to as an "illustrator") to generate or edit an interactive and/or dynamic illustration via a graphical interface. Thus, dynamic illustration application 190 allows an illustrator to define and/or modify interactive behavior between two or more visual entities in the illustration. To that end, in some embodiments, dynamic illustration application 190 includes an interactive mode module 191, an editing mode module 192, and a graphical user interface (GUI) module 193.

Interactive mode module 191 is configured to cause an interactive and/or dynamic illustration to be displayed to a user (hereinafter referred to as an "interactive viewer"), receive inputs from the interactive viewer, and cause the displayed content to react to these inputs appropriately. In some embodiments, interactive mode module 191 may cause an illustration to be displayed that is both interactive and dynamic.

An interactive illustration, unlike conventional images or videos, generally includes one or more visual objects with which a viewer can interact. For example, when interactive mode module 191 causes an interactive illustration to be displayed on display device 181, the interactive viewer may select, drag, rotate, swipe, or otherwise interact with visual objects in the illustration via screen-based input to interact with the illustration This interaction results in a corresponding change in the interactive illustration when the gesture corresponds to a visual parameter defined as an adjustable parameter. For instance, in editing mode (described below) an illustrator can set the visual parameter for rotation to be adjustable, so that in interactive mode, the object will rotate only, while all the other visual parameters would remain unchanged.

A dynamic illustration, unlike static images, generally includes one or more animated visual entities whose behavior is driven by one or more visual parameters. These visual parameters encode visual, spatial, temporal, and quantitative information associated with an animated visual entity of a dynamic illustration. For example, visual parameters for a particular visual entity may include animation parameters (e.g. velocity, granular velocity), spatial parameters (e.g. rotation, location), quantitative parameters (e.g. amount of emission, length of texture), and other visual parameters (e.g. opacity). Thus, a change in the value of a particular visual parameter results in interactive mode module 191 modifying the behavior of one or more animated visual entities of the dynamic illustration, such as rotational or translational velocity of a visual entity, rate at which objects are emitted from an emitting texture, rate at which an animated visual entity oscillates, etc.

Editing mode module 192 is configured to enable an illustrator to create and edit an interactive and/or dynamic illustration, including the visual entities included therein. For example, editing mode module 192 may provide various graphical tools for creating and editing dynamic and interactive entities. Suitable graphical tools may include a drawing tool for drawing a visual entity or background content with a series of sketch strokes, an object tool for defining a particular collection of sketch strokes as a single visual entity (i.e., an object), an emitting texture tool for defining a particular collection of sketch strokes as an emitting texture, an oscillating texture tool for defining a particular collection of sketch strokes as an oscillating texture, and an entity select tool for selecting previously defined visual entities as part of a property-editing process. In some embodiments, editing mode module 192 may include additional graphical tools for generating other types of visual entities.

In addition, according to some embodiments, editing mode module 192 enables an illustrator to enter graph mode, in which functional relationships between interactive visual entities of a dynamic illustration are created and edited. In graph mode, creation and editing of such functional relationships is performed via a GUI rather than via a textual programming procedure. Editing mode module 192 enables an illustrator to graphically create a functional relationship between a first visual entity and a second visual entity. Thus, the illustrator may create such a functional relationship by sketching a line from the first visual entity to the second visual entity. The illustrator may then further define the functional relationship by associating a source parameter of the first object (e.g., translation) and a target parameter of the second object (e.g., rotation) with the functional relationship, for example by selecting appropriate parameter buttons displayed proximate the first and second objects. Subsequently, when the dynamic illustration is viewed by an interactive viewer, as the first object is dragged along a translation path by the interactive viewer, the second object rotates at a predefined rotational rate that is a function of the position of the first object along the translational path.

In graph mode, the dynamic illustration is presented as an abstracted view of the interactive visual entities of the illustration and of any functional relationships currently extant between such entities. For example, in some embodiments, interactive visual entities of the dynamic illustration are displayed as nodes of a relational graph, and each functional relationship is displayed as a one-dimensional visual element or "edge" (e.g., a line, an arc, a curve, etc.) that visually links the interactive visual entities associated with the functional relationship. For clarity, the nodes in the relational graph are displayed in the context of the dynamic illustration canvas (or background) so that each node is positioned at the location in the dynamic illustration associated with the corresponding interactive visual entity. In some embodiments, the nodes of the relational graph are color-coded based on visual entity type, to visually indicate what type of visual entity is represented by each node (e.g., object, emitting texture, oscillating texture, etc.). One example of a relational graph is described below in conjunction with FIG. 4.

GUI module 193 causes a GUI to be displayed on display device 181 of computing device 100, the GUI being an interface that allows users to provide input to and view output from dynamic illustration application 190 through graphical icons and visual indicators. For example, GUI module 193 enables inputs to be received from an illustrator or interactive viewer through direct manipulation of the graphical elements displayed on display device 181, such as displayed buttons being selected, interactive visual objects being selected for interaction or parameter editing, edges being sketched between selected interactive objects to create functional relationships, etc. Thus, based on inputs from an illustrator or interactive viewer and on outputs from interactive mode module 191 or editing mode module 192, GUI module 193 updates the GUI displayed on display device 181 accordingly.

EMBODIMENTS

FIGS. 2A-2F show how a user can interact with a dynamic illustration via the graphical user interface of FIG. 1, according to one embodiment of the present invention. FIGS. 2A-2F are a series of views of a GUI 200 of dynamic illustration application 190, illustrating a dynamic illustration 210 during an interaction with an interactive viewer. As shown, GUI 200 includes, without limitation, a cursor 201, a frame 202 that contains dynamic illustration 210, and a menu 220 of graphical tools. In FIGS. 2A-2F, dynamic illustration 210 is displayed in interactive mode.

Dynamic illustration 210 is a dynamic scene that includes one or more animated visual entities and one or more interactive entities. In some embodiments, one or more of the interactive entities may also be animated visual entities, such as emitting textures or oscillating textures. In the embodiment illustrated in FIGS. 2A-2F, dynamic illustration 210 includes a canvas 211, which is generally a background region that is not interactive. Canvas 211 may be a static image, a repeating animated scene, such as an animated GIF, or a looped video. In FIGS. 2A-2F, dynamic illustration 210 also includes an animated object 212 and an interactive object 213.

Animated object 212 is an object that performs a predetermined animated behavior when dynamic illustration 210 is displayed in interactive mode, such as a kinetic texture. For example, animated object 212 may be an emitting texture or an oscillating texture. In the embodiment illustrated in FIGS. 2A-2F, animated object 212 (i.e., a surface 222 of a liquid in a transparent pot 223) is an emitting texture. Alternatively or additionally, animated object 212 may be an oscillating texture or any other suitable kinetic texture that has one or more temporal attributes or visual parameters, associated therewith.

An emitting texture is a kinetic texture that continuously emits a stream of objects following a global motion trajectory, guided by one or more motion paths defined by an illustrator. In addition to the one or more motion paths, other emitting texture attributes may include a texture outline, one or more masks associated with the emitting texture, emission velocity, and emission frequency. Emitted objects are removed upon crossing a texture outline, and are hidden upon passing through a mask, while the emission velocity controls velocity of the emitted objects and the emission frequency controls the frequency of the emitted objects.

An oscillating texture generally includes a duplicated collection of entities positioned along a skeleton, and the global motion of the oscillating texture is defined by oscillatory movement between the initial skeleton and a target oscillating skeleton. Oscillating textures may include a velocity attribute, which defines the speed of the global oscillations of the oscillating texture, as well as a texture outline attribute and one or more mask attributes. Any of the above-described attributes may be selectable by an illustrator when dynamic illustration 210 is displayed in graph mode.

Interactive object 213 may be any group of sketched lines selected by an illustrator and defined as an object when dynamic illustration 210 is displayed in graph mode. In FIGS. 2A-2F, interactive object 213 is an egg. Further, in graph mode, an illustrator may also associate one or more attributes (i.e., visual parameters) with interactive object 213 that define the visual (e.g., color, shape) and spatial (location, scale) properties. Suitable visual parameters that may be associated with a particular interactive object 213 include translation (along a trajectory), rotation (about a pivot), scale, opacity, and speed of ambient (local) motion, among others.

Menu 220 includes a plurality of graphical tools, which are configured to facilitate creation and modification of functional relationships and nodes of a relational graph when dynamic illustration 210 is displayed in graph mode. Suitable graphical tools may include a drawing tool for sketching drawing strokes, an erase tool for erasing portions of drawing strokes, an emitting texture button for defining a selected visual entity as an emitting texture, an oscillating texture button for defining a selected visual entity as an oscillating texture, an object button for defining a selected visual entity as an object (such as an interactive object), a select entity button for selecting a particular visual entity, a delete button for deleting drawing strokes or visual entities, a play/pause button, a graph mode button for displaying dynamic illustration 210 in graph mode, an interactive mode button for displaying dynamic illustration 210 in interactive mode, and a text button for inserting text. In some embodiments, menu 220 may include more or fewer graphical tools than those described herein.

Figure 2A:
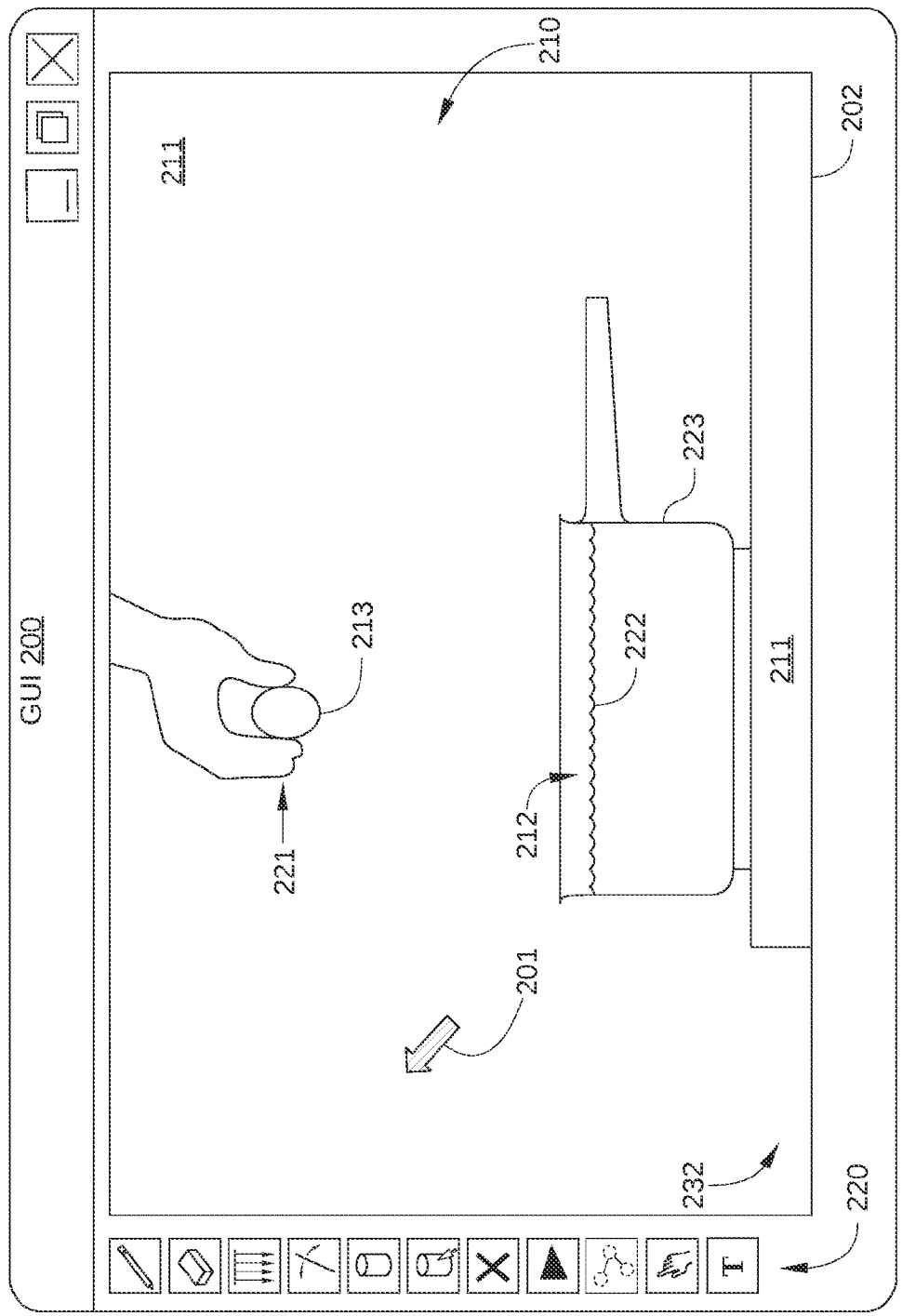

In FIG. 2A, interactive object 213 is shown at an initial location 221 over surface 222 of transparent pot 223. Surface 222 corresponds to animated object 212 (an emitting texture). By contrast, transparent pot 223 is not an interactive object or animated object, and is instead a portion of canvas 211. Due to a functional relationship (described below) between interactive object 213 and animated object 212, the emitting texture of animated object 212 does not emit objects (splashes) in FIG. 2A.

Figure 2B:
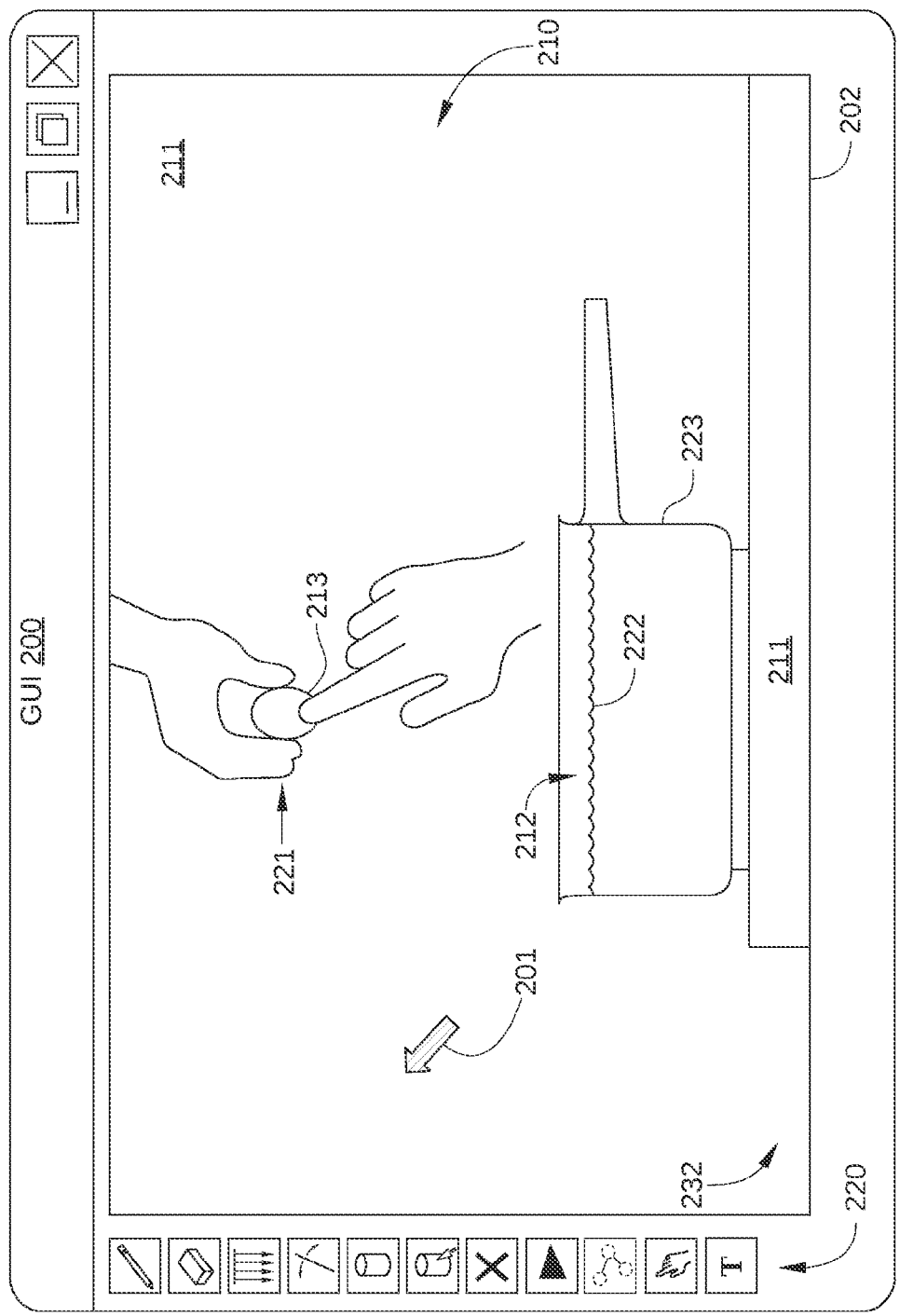

In FIG. 2B, an interactive viewer selects interactive object 213. In embodiments in which display device 181 is a conventional screen, such a selection may be made with cursor 201. In embodiments in which display device 181 includes a touch-sensitive screen, such a selection may be made with cursor 201 or a hand- or finger-gesture thereon. In FIG. 2C, the interactive viewer moves interactive object 213 along a motion path 203 that is associated with interactive object 213 by dragging interactive object 213 with a cursor-based or gesture-based input. Accordingly, GUI module 193 updates GUI 200 so that interactive object 213 is displayed to follow the cursor or gesture along motion path 203, and interactive object 213 is displayed on display device 181 accordingly. In FIG. 2C, motion path 203 is shown for reference, but in some embodiments, motion path 203 is not displayed to the interactive viewer when interactive object 213 is displayed in interactive mode.

Figure 2D:
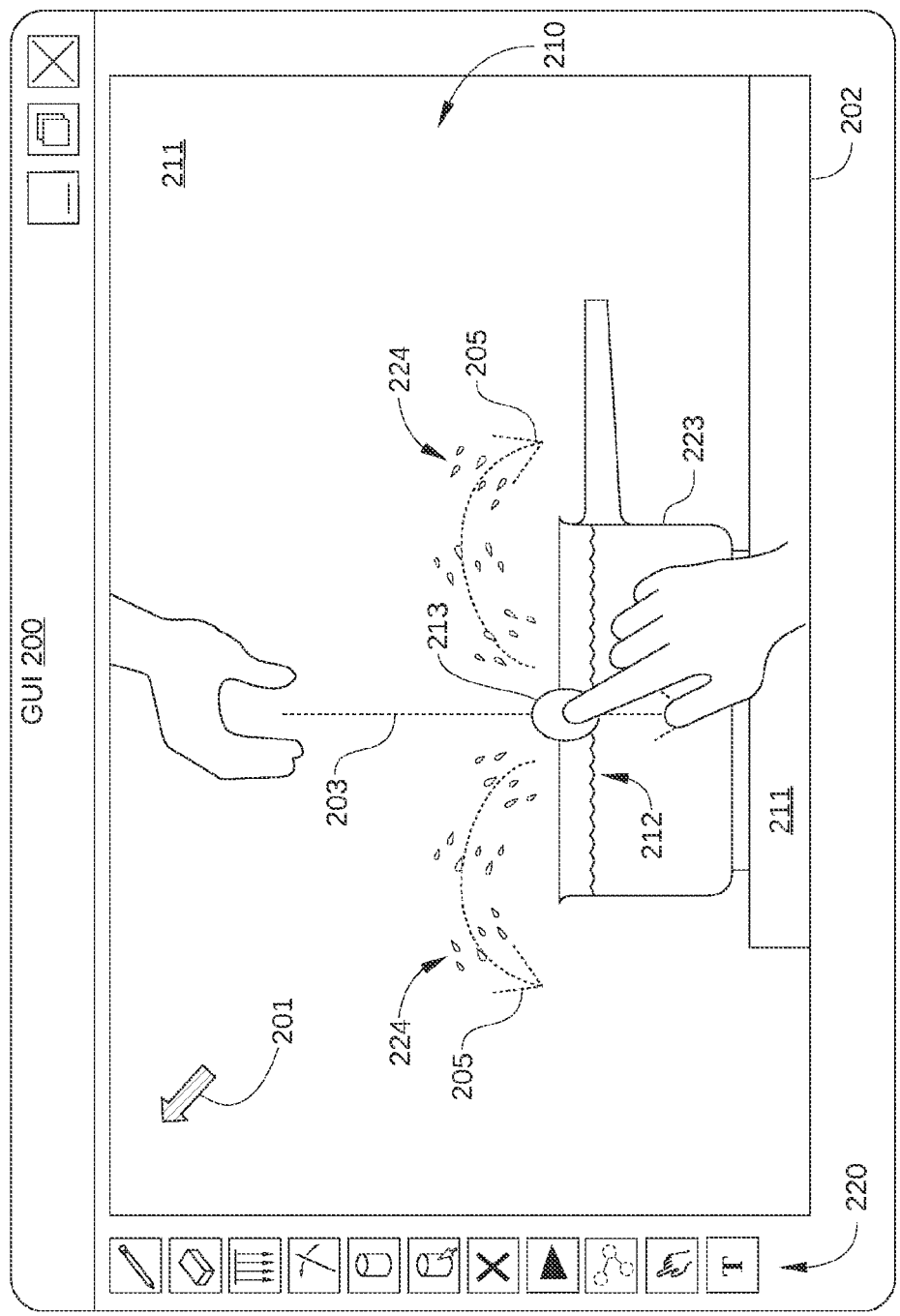

In FIG. 2D, the interactive viewer moves interactive object 213 into contact with animated object 212 (i.e., surface 222 of liquid in transparent pot 223) by dragging interactive object 213 further along motion path 203, and animated object 212 begins emitting objects 224 (i.e., splash droplets). Objects 224 are displayed following motion paths 205 in FIG. 2D, because the translation of interactive object 213 has reached a predefined location (i.e., surface 222) on motion path 203. As defined by the functional relationship (described below) between a visual parameter of interactive object 213 (the emission rate of objects 224) and a visual parameter of animated object 212 (the translation location), emission of objects 224 begins when interactive object 213 has reached the predefined location.

Figure 2E:
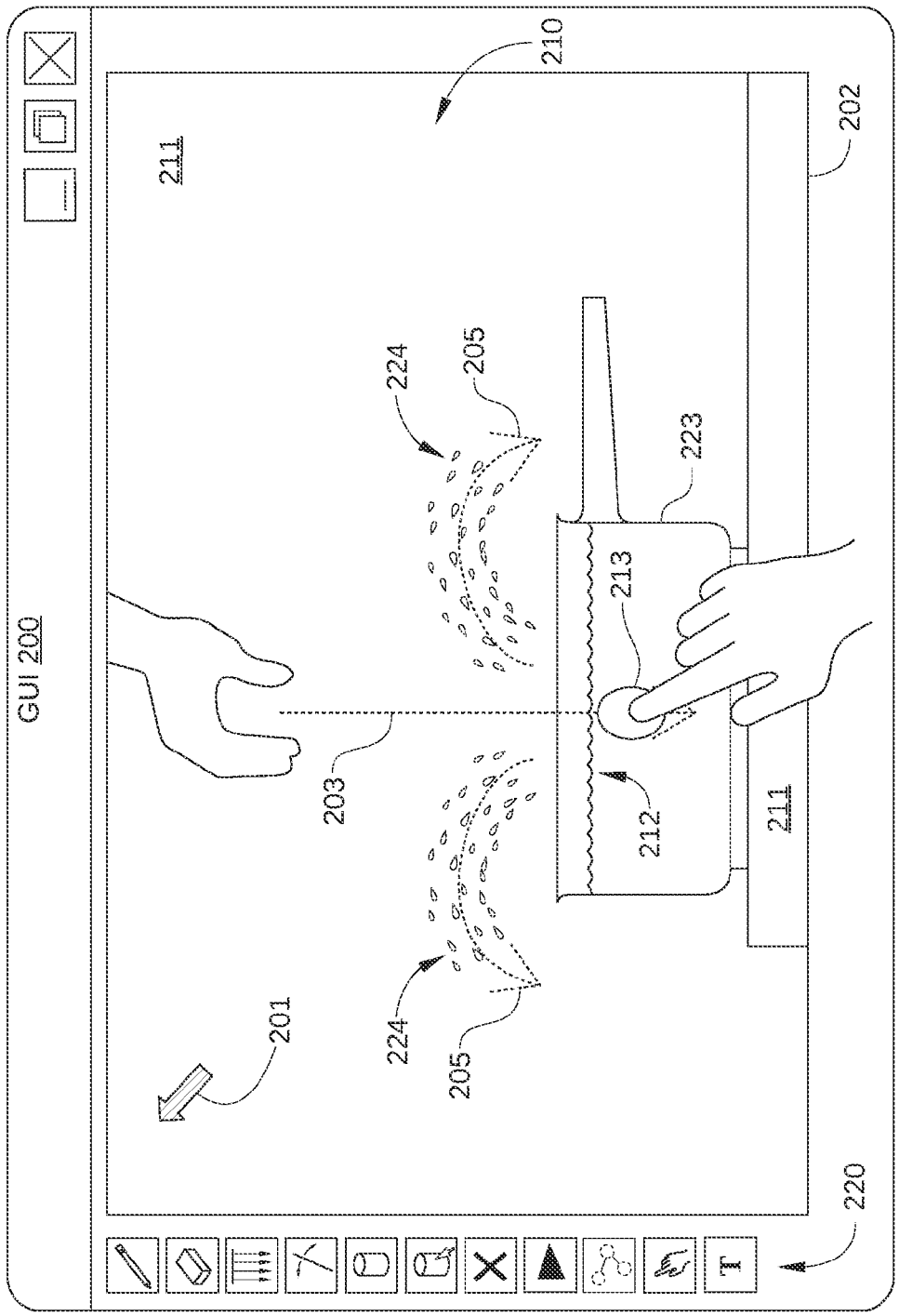
Figure 2F:
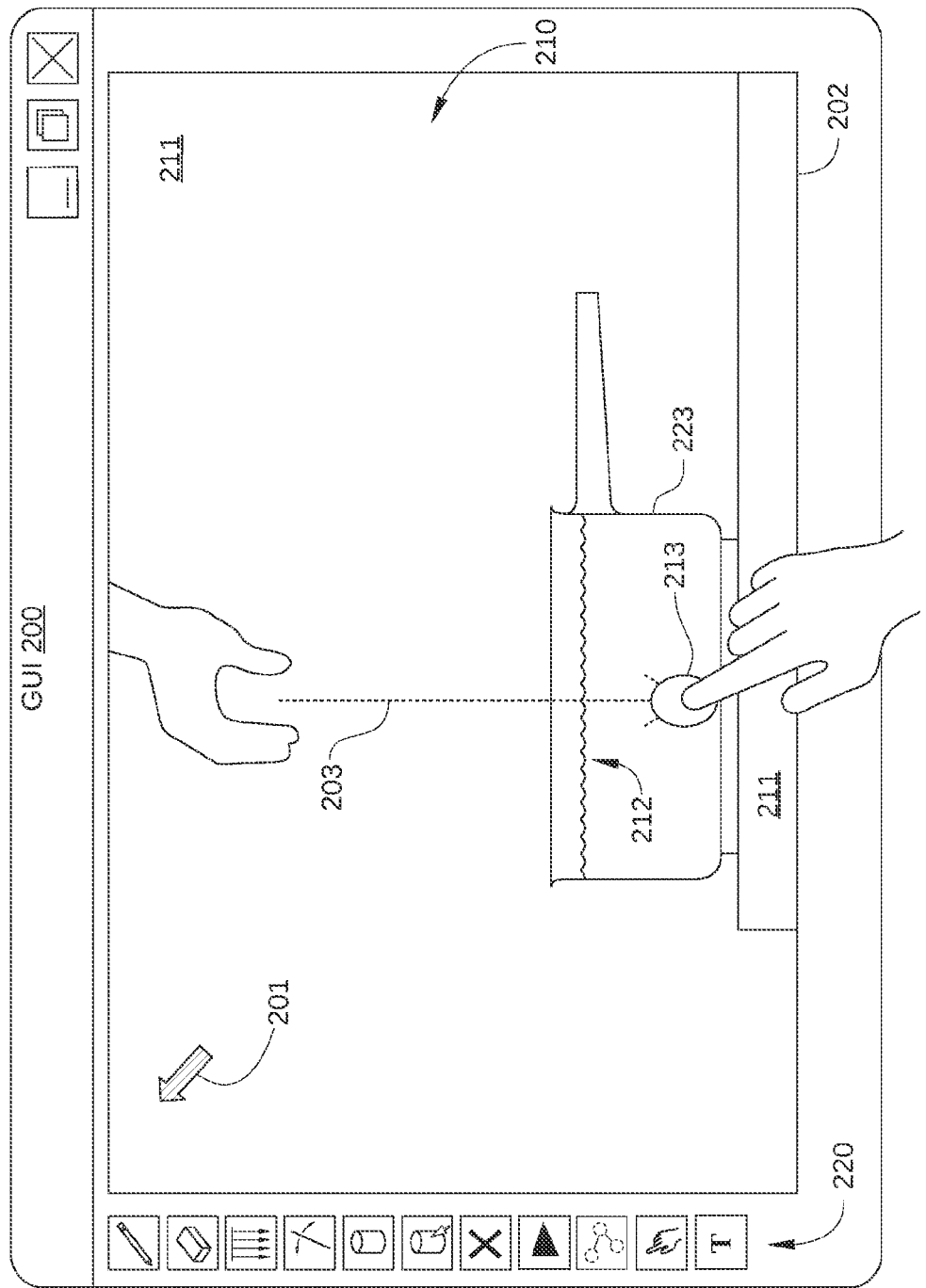

In FIG. 2E, the interactive viewer moves interactive object 213 below surface 222 by dragging interactive object 213 further along motion path 203, and animated object 212 emits objects 224 at a greater emission rate. Objects 224 continue to be displayed following motion paths 205 in FIG. 2D. The greater emission rate of objects 224 being displayed in FIG. 2E is quantitatively defined by the functional relationship (described below) between the emission rate of objects 224 and the translation location of animated object 212. In FIG. 2F, the interactive viewer moves interactive object 213 to the end of motion path 203, and objects 224 are no longer displayed emitting from interactive object 213, as defined by the functional relationship between the emission rate of objects 224 and the translation location of animated object 212.

Thus, in the dynamic scene presented by dynamic illustration 210, visual entities can interact with one another. Specifically, dynamic illustration 210 depicts the coordination and cause-and-effect relations between the interacting visual entities, i.e., the visual entities in dynamic illustration 210 between which a functional relationship has been defined by an illustrator. As shown, based on inputs received via GUI 200 from an interactive viewer, interactive mode module 191 of dynamic illustration application 190 alters the behavior and/or location of one or more interactive objects 213 in dynamic illustration 210. Furthermore, based on a functional relationship that is defined between a visual parameter of interactive object 213 (e.g., translation location) and a visual parameter of animated object 212 (e.g., emission rate of objects 224), an animated behavior of animated object 213 is modified. Thus, in the embodiment illustrated in FIGS. 2A-2F, a visual parameter of animated object 213 is dependent on a visual parameter of interactive object 213.

In alternative embodiments, functional relationships in dynamic illustration 210 may also be defined in graph mode between the visual parameters of any combination of interactive objects and animated objects. For example, a visual parameter of an interactive object may be dependent on a visual parameter of an animated object or on a visual parameter of another interactive object. According to embodiments of the present invention, the above-described functional relationships may be created and modified via GUI 200, rather than a programming or scripting procedure. One such embodiment is illustrated in FIGS. 3A-3E.

FIGS. 3A-3E show how a user can modify the dynamic illustration of FIGS. 2A-2F while working in a graph mode, according to one embodiment of the present invention. To that end, FIGS. 3A-3E are a series of views of GUI 200 illustrating dynamic illustration 210 while being modified in graph mode by an illustrator. As shown, in graph mode, GUI 200 includes, without limitation, cursor 201, frame 202, dynamic illustration 210, canvas 211, a relational graph 300 superimposed on dynamic illustration 210, and menu 220 of graphical tools.

Figure 3A:
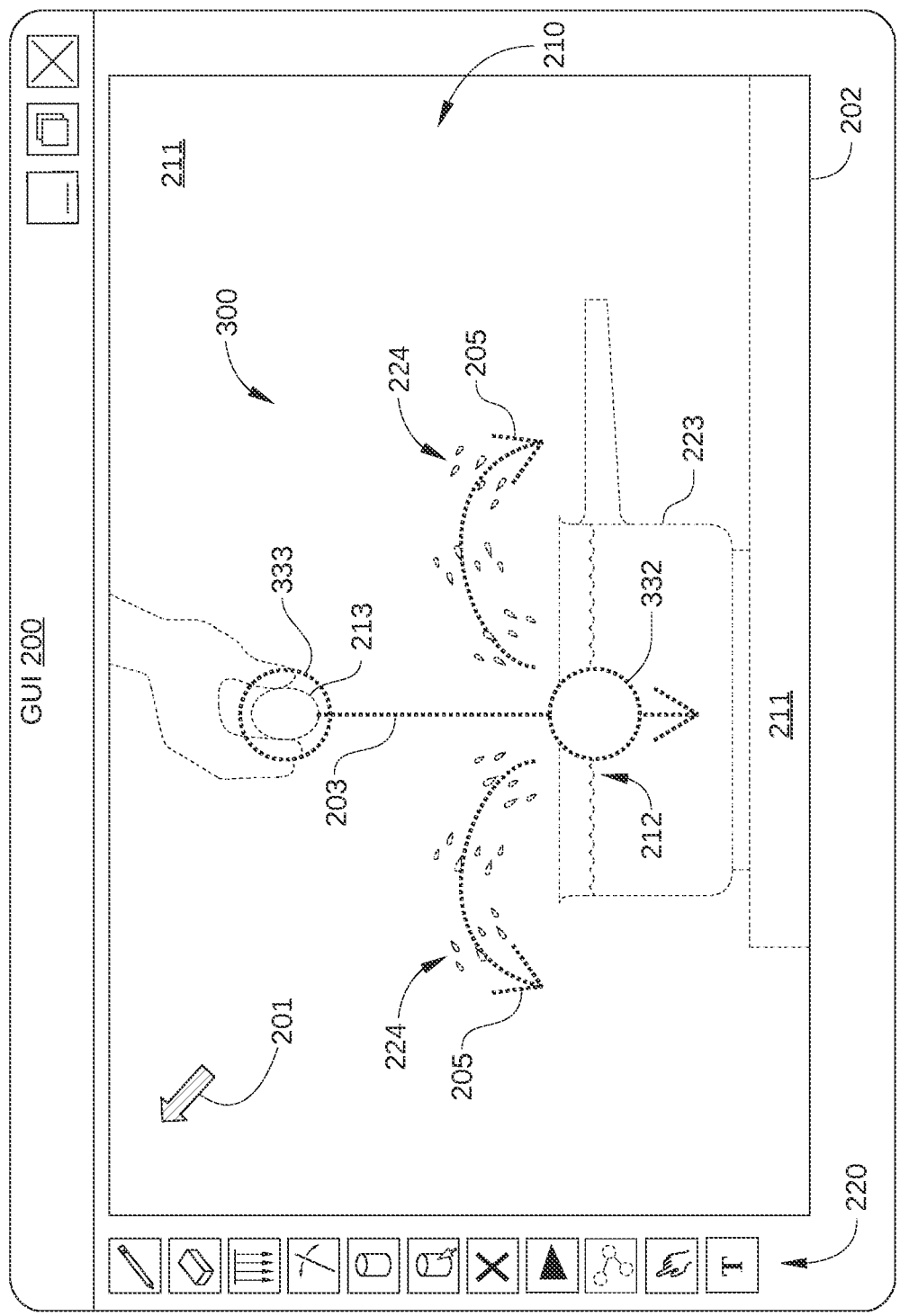
FIGS. 3A-3E show how a user can modify the dynamic illustration of FIGS. 2A-2F while working in a graph mode, according to one embodiment of the present invention.

Relational graph 300 is an abstract graph view of dynamic illustration 210, and includes nodes (e.g., 332 and 333) and edges superimposed over canvas 211. A node is displayed for each animated object and interactive object of dynamic illustration 210, and an edge is displayed for each functional relationship of dynamic illustration 210. In FIG. 3A, no edges are shown, since no functional relationships are currently defined. In some embodiments, when dynamic illustration 210 is displayed in graph mode, some or all visual entities of dynamic illustration 210 may be rendered as washed out or less visible than when displayed in interactive mode, so that the components of relational graph 300 are more readily discernible to the illustrator. In addition, in some embodiments, motion paths 203 and 205, which have been sketched previously by an illustrator, are displayed or can be made visible in graph mode.

Any suitable algorithm may be employed by editing mode module 192 to generate the relational graph associated with a particular dynamic illustration. For example, in one embodiment, editing mode module 192 employs a force-directed algorithm to associate each visual entity of dynamic illustration 210 with a node in the relational graph and to automatically position each node.

Initially, in FIG. 3A, a node 332 and a node 333 are shown superimposed on canvas 211. Node 332 corresponds to animated object 212 and is displayed in a position corresponding to the location on canvas 211 of animated object 212. Similarly, node 333 corresponds to interactive object 213 and is displayed in a position corresponding to the location on canvas 211 of interactive object 213. In addition, objects 224 are displayed as being continuously emitted from animated object 212 at a default emission rate.

Figure 3B:
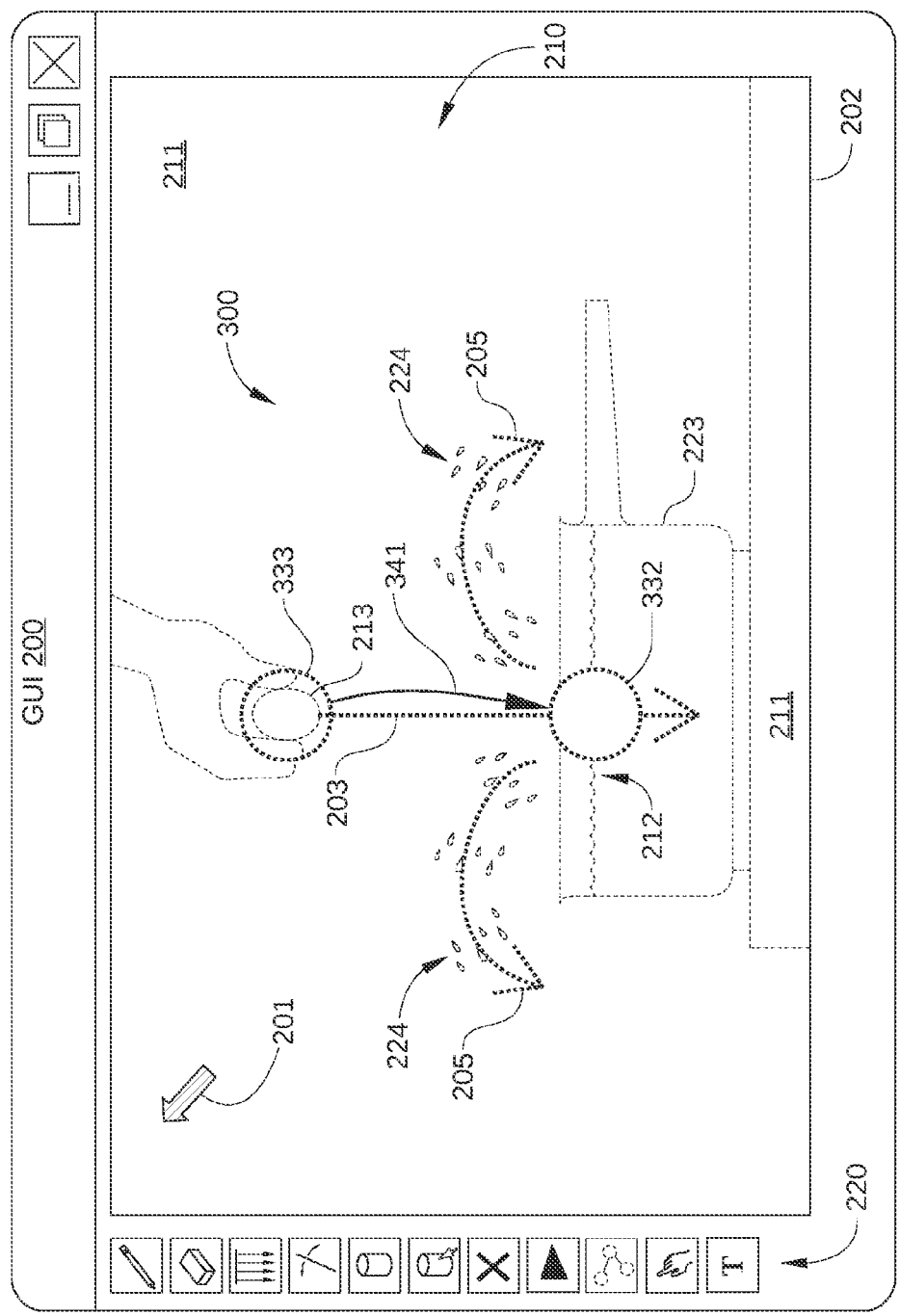

In FIG. 3B, to define a functional relationship between two visual entities of dynamic illustration 210, an illustrator sketches a one-dimensional visual element, or edge 341 (e.g., a line, curve, or arc) from a source node, in this case node 333, to a target node, in this case node 332. Edge 341 is a graphical representation of the functional relationship between the source node and the target node that visually informs an illustrator of this functional relationship. Edge 341 is directed from the source node to the target node (as denoted in FIG. 3B with a directional arrow), and has a functional mapping associated therewith (described below in conjunction with FIG. 3E). This functional mapping includes a correspondence function that encodes the dependent behavior from a specific visual parameter of the target node to a specific visual parameter of the source node. For example, in FIGS. 3A-3E, the illustrator causes the emission rate of objects 224 from node 332 (the target node) to be a function of the position along motion path 203 of interactive object 213 (the source node). Edge 341 may be sketched either with cursor 201, some other input device (e.g., a stylus), or with a gesture-based input on a touch-sensitive screen.

Figure 3C:
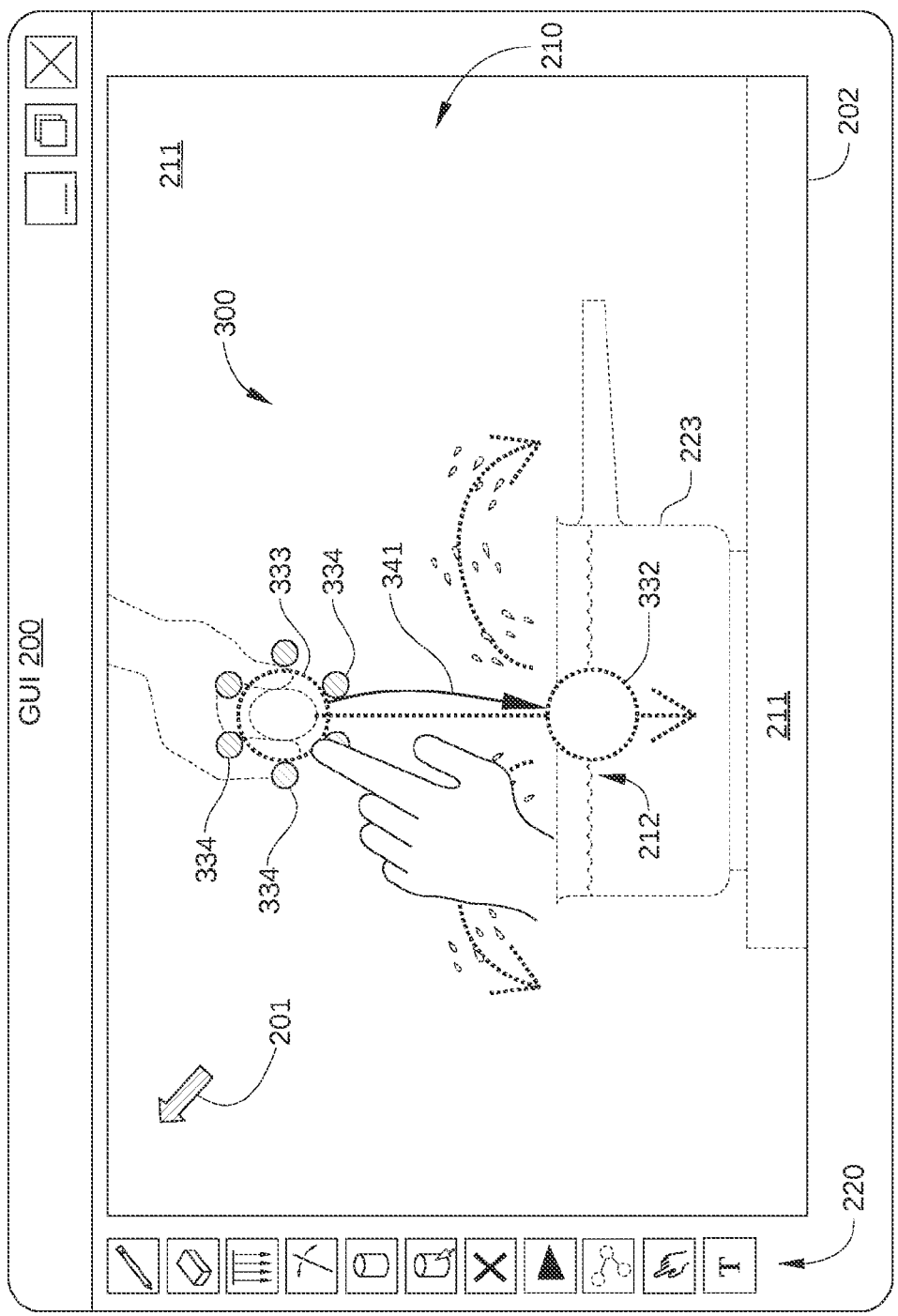

In FIG. 3C, the illustrator defines characteristics of the functional relationship represented by edge 341 by selecting the source node (node 333) and a visual parameter associated therewith (translation path). The source node may be a node associated with an animated entity and/or an interactive entity. As shown, editing mode module 192 is configured to cause icons 334 associated with each visual parameter of the source node to be displayed proximate the source node. In FIG. 3C, six visual parameters are depicted for the source node, but any number of visual parameters may be associated with a particular type of visual entity. Suitable visual parameters for an object-type visual entity include rotation, translation path, scale, opacity, ambient velocity, and the like; suitable visual parameters for an emission texture-type visual entity include global entity velocity, opacity, emission velocity, ambient velocity, scale, and the like; and suitable visual parameters for an oscillation-type visual entity include global entity velocity, opacity, texture length, ambient velocity, scale, and the like.

Figure 3D:
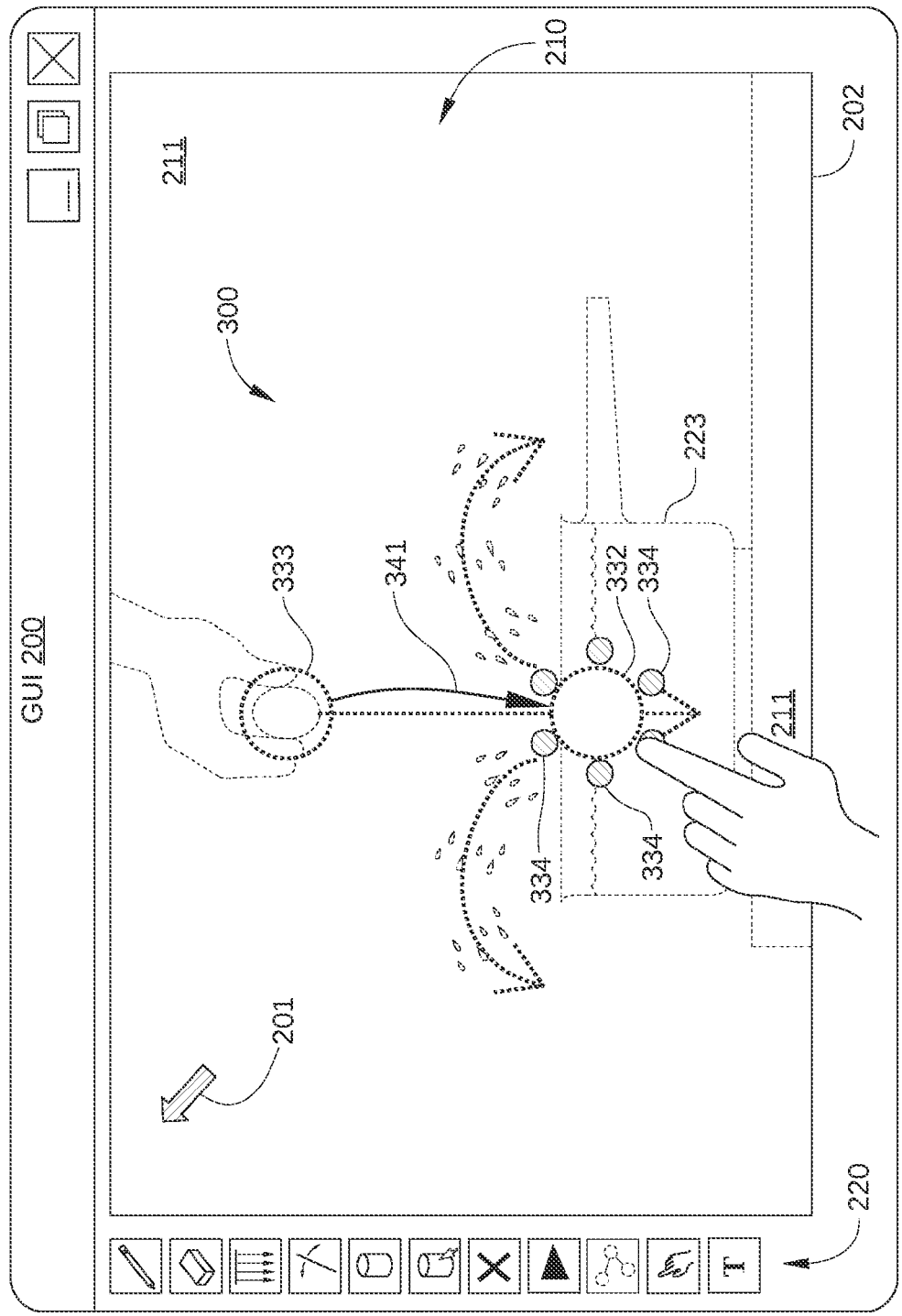

In FIG. 3D, the illustrator further defines characteristics of the functional relationship represented by edge 341 by selecting the target node (node 332) and a visual parameter associated therewith (emission rate). The target node may be a node associated with either an animated object or an interactive object. As shown, editing mode module 192 is configured to cause icons 334 associated with each visual parameter of the target node to be displayed proximate the target node.

Figure 3E:
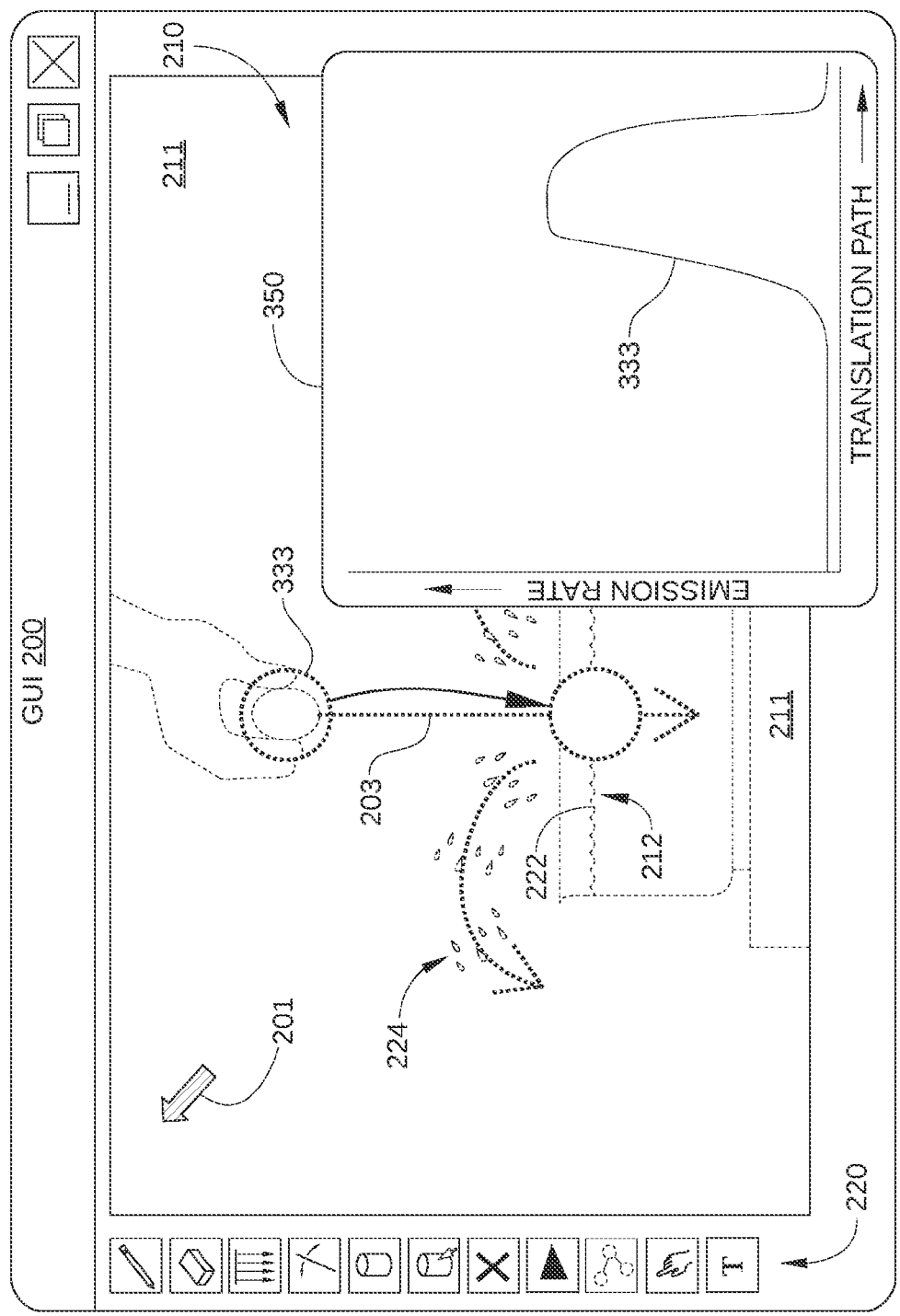

In FIG. 3E, the illustrator further defines characteristics of the functional relationship represented by edge 341 by defining a functional correspondence between the visual parameter of the source node and the visual parameter of the target node. In some embodiments, the illustrator further defines the functional correspondence graphically as a two-dimensional function. For example, in some embodiments, editing mode module 192 is configured to cause a function-mapping graphical interface 350, such as a mapping widget, to be displayed upon selection of the visual parameter of the source node and the visual parameter of the target node. Function-mapping graphical interface 350 facilitates definition of the functional correspondence between the visual parameter of the source node and the visual parameter of the target node by accepting inputs from an illustrator via GUI 200. Specifically, function-mapping graphical interface 350 visualizes the quantifiable relationship between the visual parameter of the source node and the visual parameter of the target node, and enables the illustrator to modify this quantifiable relationship graphically, as described below.

In some embodiments, function-mapping graphical interface 350 depicts the functional correspondence between the visual parameter of the source node and the visual parameter of the target node as a mapping curve 351. In such embodiments, GUI 200 enables the illustrator to edit this functional correspondence by sketching the mapping curve 351 to a particular shape. For example, in FIG. 3E, the emission rate of objects 224 from node 332 (i.e., animated object 212) is initially zero, increases as the visual entity associated with node 333 (i.e., interactive object 213) first contacts surface 222, increases further as the visual entity associated with node 333 continues along motion path 203 past surface 222, then ceases when the visual entity associated with node 333 reaches the end of motion path 203.

As shown, the above-described functional correspondence between a visual parameter of one visual entity (i.e., the emission rate of objects 224 from animated object 212) and a visual parameter of another visual entity (i.e., the location of interactive object 213 along motion path 203) can be sketched graphically by the illustrator in function-mapping graphical interface 350. Thus, an illustrator can define the functional correspondence between a visual parameter of a first visual entity and a visual parameter of a second visual entity by using the visual parameter of the first visual entity as an independent variable of the functional correspondence and the visual parameter of the second visual entity as a dependent variable of the functional correspondence.

In some embodiments, function-mapping graphical interface 350 is configured to define a functional correspondence between a visual parameter of the source node and a visual parameter of the target node based on a set of data values or a mapping function. Thus, in such embodiments, function-mapping graphical interface 350 may employ a data set or mapping function to determine values for the dependent variable of mapping curve 351. Consequently, in such embodiments, precise functional relationships can be implemented, which is particularly beneficial for infographics and related applications. In such embodiments, the data set or mapping function can be imported to function-mapping graphical interface 350 by an illustrator via graphical inputs, for example via a graphical tool button in menu 220, thereby obviating the need for employing textual programming inputs.

In the embodiment illustrated in FIGS. 3A-3E, a single functional relationship is established between node 332 and node 333. In other embodiments, multiple functional relationships may be established by an illustrator between node 332 and node 333. In one embodiment, two visual parameters of node 332 may be dependent on one or more visual parameters of node 333. For example, an illustrator may select both the emission rate (from node 332) and translation path (of node 332) to be dependent on the translation path of node 333. In this way, the emission of objects 224 from node 332 and a change in the height of surface 222 occur when node 333 (i.e., interactive object 213) is moved along translation path 203 below surface 222.

In some embodiments, editing mode module 192 may be configured to enable an illustrator to select a first visual parameter of a first visual entity to be dependent on a visual parameter of a second visual entity and a second visual parameter of the first visual entity to be dependent on a visual parameter of a third visual entity. Thus, the first visual entity may be a target node for two different functional relationships: one in which the second visual entity is the source node of the functional relationship and another in which the third visual entity is the source node of the functional relationship.

In some embodiments, editing mode module 192 may be configured to enable an illustrator to establish a chain of functional relationships. That is, a target node for a first function relationship defined by the illustrator may also be a source for a second functional relationship. One such embodiment is illustrated in FIG. 4.

Figure 4:
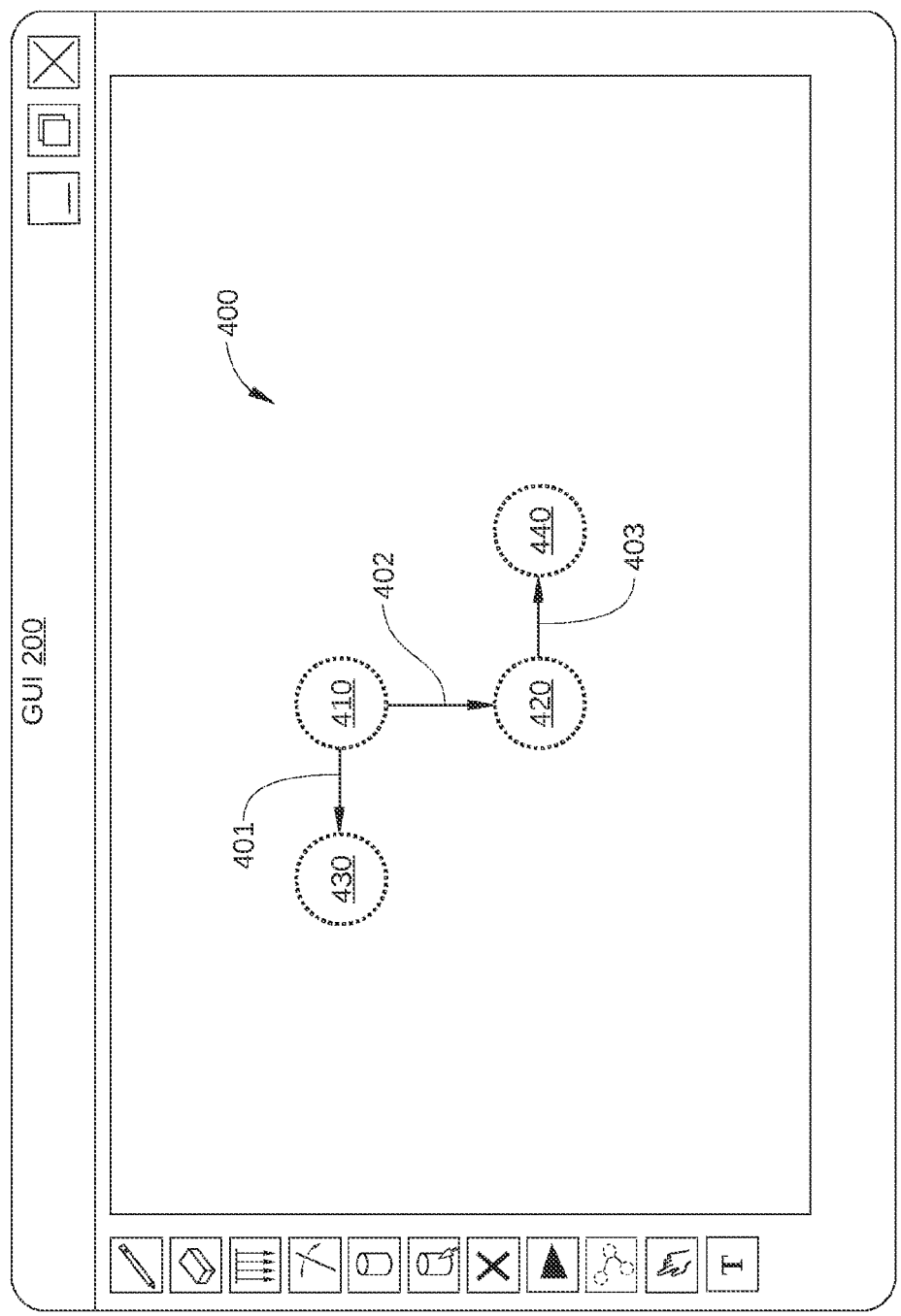
FIG. 4 illustrates a relational graph associated with the dynamic illustration of FIGS. 2A-2F that is displayed via the graphical user interface of FIG. 1, according to one embodiment of the present invention.

FIG. 4 illustrates a relational graph associated with the dynamic illustration of FIGS. 2A-2F that is displayed via the graphical user interface of FIG. 1, according to one embodiment of the present invention. FIG. 4 is a view of GUI 200 displaying a relational graph 400 associated with a dynamic illustration. Generally, in graph mode, GUI 200 displays relational graph 400 superimposed on the dynamic illustration associated therewith, but for clarity, this dynamic illustration is omitted in FIG. 4. Relational graph 400 includes, without limitation, a primary source node 410, a secondary source node 420, a first target node 430, and a second target node 440, each associated with a different visual entity of the dynamic illustration, such as an interactive object, an emitting texture, or an oscillating texture. Furthermore, GUI 200 displays a functional relationship 401 between primary source node 410 and first target node 430, a function relationship 402 between primary source node 410 and secondary source node 420, and a functional relationship 403 between secondary source node 420 and second target node 440.

As indicated by directional arrows in FIG. 4, in functional relationship 401, primary source node 410 is the source node and first target node 430 is the target node; in function relationship 402, primary source node 410 is the source node and secondary source node 420 is the target node; and in functional relationship 403, secondary source node 420 is the source node and second target node 440 is the target node. Thus, secondary source node 420 is selected as both a source node and a target node in relational graph 400. In some embodiments, the visual parameter of secondary source node 420 that is associated with functional relationship 402 is also the visual parameter that is associated with functional relationship 403. In such embodiments, functional relationship 402 and functional relationship 403 form a chain of functional relationships. Consequently, interaction with primary source node 410 by an interactive viewer can directly affect the visual behavior of second target node 440, even though there is no direct functional relationship defined between primary source node 410 and second target node 440.

Figure 5:
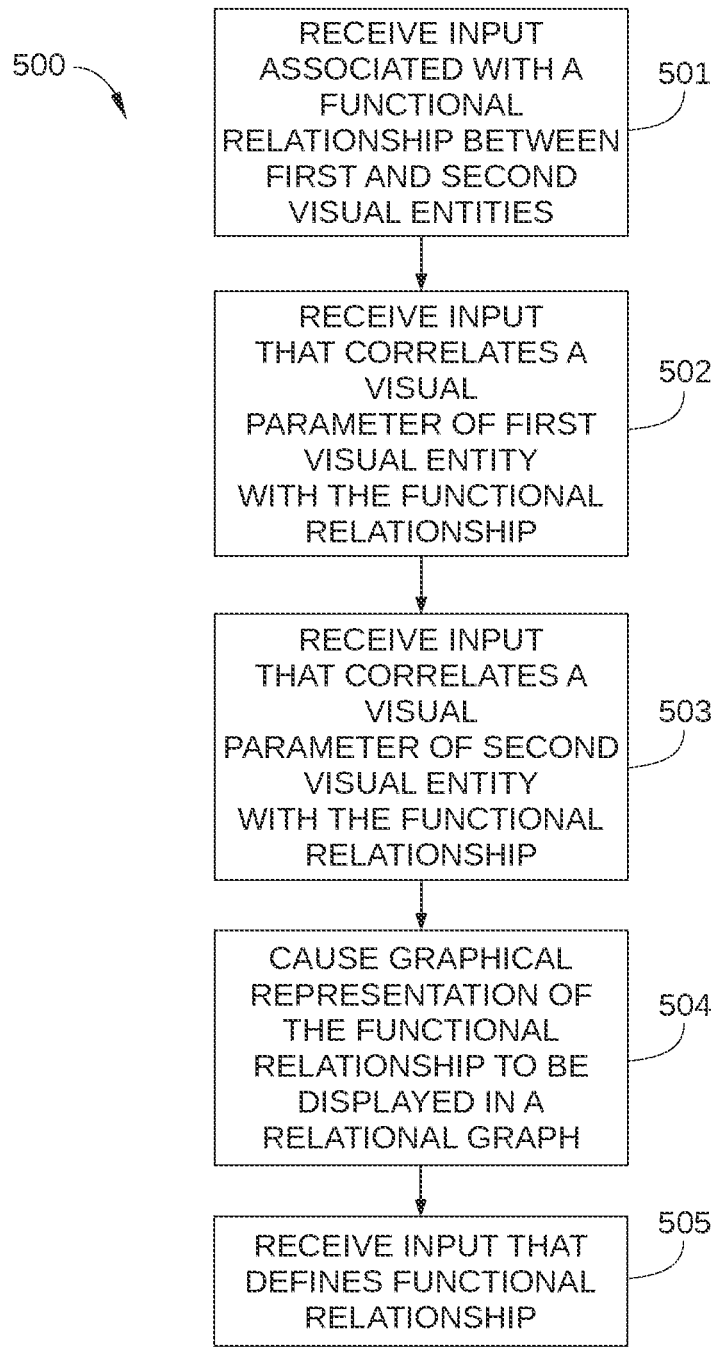
FIG. 5 is a flowchart of method steps for modifying a dynamic illustration, according to one embodiment of the present invention.

FIG. 5 is a flowchart of method steps for modifying a dynamic illustration, according to one embodiment of the present invention. Although the method steps are described in conjunction with the systems of FIGS. 1-4, persons skilled in the art will understand that any system configured to perform the method steps, in any order, is within the scope of the present invention.

In some embodiments, prior to the method steps, a dynamic illustration, such as dynamic illustration 210 of FIG. 2, may be partially created by an illustrator. For example, sketch strokes may be drawn by the illustrator and defined as part of a canvas. In addition, sets of sketch strokes may each be defined as a specific visual entity. Thus, each such set may be defined as an interactive object, an emitting texture, or an oscillating texture. Some or all visual parameters associated with each visual entity may also be defined by the illustrator, including translation paths, oscillation velocities, locations of masks and texture outlines, and the like. Dynamic illustration application 190 may then generate a relational graph that presents an abstracted view of the interactive visual entities of the dynamic illustration.

As shown, a method 500 begins at step 501, where dynamic illustration application 190 is in graph mode and receives a first input associated with a functional relationship between a first visual entity in a dynamic illustration and a second visual entity in the dynamic illustration. The first input may be received via GUI 200 in response to the functional relationship between the first visual entity and the second visual entity being indicated. For example, an illustrator may sketch between the first visual entity and the second visual entity in the dynamic illustration, via GUI 200, a one-dimensional visual element or edge in a relational graph associated with the dynamic illustration. Each of the nodes in such a relational graph corresponds to a respective visual entity of the dynamic illustration. Thus, using relational graph 300 in FIG. 3B as an example, the first input is received via GUI 200 when an illustrator sketches edge 341 from node 333 to node 332. In some embodiments, the nodes in the relational graph are displayed in the context of the dynamic illustration canvas (or background) so that each node is positioned at the location in the dynamic illustration associated with the corresponding visual entity. The one-dimensional visual element or edge sketched in step 501 is typically connected to the first visual entity and the second visual entity.

In step 502, dynamic illustration application 190 receives a second input that associates a visual parameter of the first visual entity with the functional relationship established in step 501. In some embodiments, the second input is generated in response to selection of the first visual entity via GUI 200. For example, an illustrator may select the first visual entity with a cursor input or with a hand- or finger-gesture on a touch-sensitive screen. Then, with a subsequent cursor input or hand- or finger-gesture, the illustrator may select a particular visual parameter using icons 334 displayed proximate the first visual entity. Using relational graph 300 in FIG. 3C as an example, the second input is received via GUI 200 when the illustrator selects node 333 and, using one of icons 334, a visual parameter associated therewith (in this case, translation path). Based on these inputs, dynamic illustration application 190 associates the particular visual parameter with the functional relationship between the first visual entity and the second visual entity, i.e., dynamic illustration application 190 defines which visual parameter of the first visual entity correlates to the functional relationship indicated in step 501.

In step 503, dynamic illustration application 190 receives a third input that associates a visual parameter of the second visual object with the functional relationship established in step 501. In some embodiments, the third input is generated in response to selection of the second visual entity via GUI 200, such as when an illustrator selects the second visual entity and a particular visual parameter associated therewith using cursor inputs or a hand- or finger-gestures as described above in step 502. Using relational graph 300 in FIG. 3D as an example, the third input is received via GUI 200 when the illustrator selects node 332 and, using one of icons 334 associated therewith, a visual parameter of node 332 (in this case, emission rate path). Based on these inputs, dynamic illustration application 190 correlates the particular visual parameter associated with the second visual entity with the functional relationship between the first visual entity and the second visual entity.

In step 504, based on the above-described first, second, and third inputs, dynamic illustration application 190 causes a graphical representation of the functional relationship to be displayed in the relational graph of the dynamic illustration. For example, in some embodiments, dynamic illustration application 190 causes the graphical representation of the functional relationship to be displayed in the relational graph. Furthermore, in some embodiments, the graphical representation is displayed to visually link the first visual object and the second visual object in the relational graph. In some embodiments, the graphical representation may be a one-dimensional visual element (such as a line, edge, or curve) that is connected to the first visual entity and the second visual entity.

In step 505, dynamic illustration application 190 receives a fourth input that quantitatively defines the functional relationship, where the fourth input is generated in response to inputs by an illustrator via GUI 200. Specifically, the functional relationship indicated in step 501 between the visual parameter associated with the first visual entity and the visual parameter associated with the second visual entity is further defined to indicate how much and in what way the visual parameter associated with the second visual entity (the dependent parameter) varies with respect to changes in the visual parameter associated with the first visual entity first (the independent parameter).

In some embodiments, dynamic illustration application 190 defines the functional relationship graphically. For example, an illustrator may sketch or edit a mapping curve associated with the functional relationship between the first visual entity and the second visual entity. In some embodiments, dynamic illustration application 190 is configured to provide a function-mapping graphical interface for sketching or editing such a mapping curve. In such embodiments, the visual parameter of the first visual entity may be used as an independent variable of the functional relationship and the visual parameter of the second visual entity may be used as a dependent variable of the functional relationship. Alternatively, the second visual entity may be used as the independent variable of the functional relationship and the visual parameter of the first visual entity may be used as the dependent variable of the functional relationship. Alternatively or additionally, in some embodiments, dynamic illustration application 190 defines the functional relationship using a dependent variable that is based on a set of data values or a mapping function. In such embodiments, prior to causing the graphical representation of the quantifiable relationship to be displayed in step 504, dynamic illustration application 190 may receive the set of data values as a user input or as an imported file.

In sum, embodiments of the present invention provide systems and method for modifying a dynamic illustration. Illustrator inputs for editing functional relationships between visual entities in the dynamic illustration are received via a graphical interface such as a relational graph. To provide additional context to the abstract relational graph, the graphical interface may display the relational graph superimposed on the dynamic illustration being edited.

At least one advantage of the techniques described herein is that interactive behavior of visual entities in a dynamic illustration can be specified graphically, via inputs to a relational graph associated with the dynamic illustration. Consequently, extensive programming skills are not required for an illustrator to edit or create a dynamic illustration. Moreover, because the relational graph can be superimposed on the dynamic illustration, a dynamic illustration application provides an interface that intuitively displays functional relationships between visual entities in the dynamic illustration.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for modifying a dynamic illustration, the method comprising:
    receiving a first input, via a graphical user interface, associated with a functional relationship between a first visual entity included in the dynamic illustration and a second visual entity included in the dynamic illustration;
    receiving a second input, via the graphical user interface, that correlates a first visual parameter associated with the first visual entity with the functional relationship;
    receiving a third input, via the graphical user interface, that correlates a second visual parameter associated with the second visual entity with the functional relationship;
    receiving a fourth input, via the graphical user interface, that modifies a quantitative definition of the functional relationship, wherein the quantitative definition includes a two-dimensional mapping curve that graphically represents the functional relationship between the first visual entity correlated with the first visual parameter and the second visual entity correlated with the second visual parameter, and graphically modifies the two-dimensional mapping curve that graphically represents the functional relationship;
    generating a graphical representation of the first visual entity and the second visual entity based on the modified two-dimensional mapping curve; and
    displaying the graphical representation of the first visual entity and the second visual entity via the graphical user interface.

2. The method of claim 1, wherein receiving the first input comprises receiving the first input via the graphical user interface in response to the functional relationship between the first visual entity and the second visual entity being indicated.

3. The method of claim 1, wherein the first visual parameter associated with the first visual entity defines an animation behavior of the first visual entity and the second visual parameter associated with the second visual entity defines an animation behavior of the second visual entity.

4. The method of claim 1, wherein receiving the second input comprises receiving the second input via the graphical user interface in response to selection of the first visual entity and receiving the third input comprises receiving the third input via the graphical user interface in response to selection of the third visual entity.

5. The method of claim 4, wherein the first visual parameter associated with the first visual entity is selected from multiple visual parameters associated with the first visual entity.

6. The method of claim 4, further comprising causing the first visual entity and the second visual entity to be displayed while superimposed on the dynamic illustration.

7. The method of claim 1, wherein the first visual entity is one of an interactive object, an animated object, an emitting texture, or an oscillating texture, and the second visual entity is one of an interactive object, an animated object, an emitting texture, or an oscillating texture.

8. A non-transitory computer readable medium storing instructions that, when executed by a processor, cause the processor to perform the steps of:
    receiving a first input, via a graphical user interface, associated with a functional relationship between a first visual entity included in the dynamic illustration and a second visual entity included in the dynamic illustration;
    receiving a second input, via the graphical user interface, that correlates a first visual parameter associated with the first visual entity with the functional relationship;
    receiving a third input, via the graphical user interface, that correlates a second visual parameter associated with the second visual entity with the functional relationship;
    receiving a fourth input, via the graphical user interface, that modifies a quantitative definition of the functional relationship, wherein the quantitative definition includes a two-dimensional mapping curve that graphically represents the functional relationship between the first visual entity correlated with the first visual parameter and the second visual entity correlated with the second visual parameter, and graphically modifies the two-dimensional mapping curve that graphically represents the functional relationship;
    generating a graphical representation of the first visual entity and the second visual entity based on the modified two-dimensional mapping curve; and
    displaying the graphical representation of the first visual entity and the second visual entity via the graphical user interface.

9. The non-transitory computer readable medium of claim 8, wherein receiving the first input comprises receiving the first input via the graphical user interface in response to the functional relationship between the first visual entity and the second visual entity being indicated.

10. The non-transitory computer readable medium of claim 8, wherein the first visual parameter associated with the first visual entity defines an animation behavior of the first visual entity and the second visual parameter associated with the second visual entity defines an animation behavior of the second visual entity.

11. The non-transitory computer readable medium of claim 8, wherein receiving the second input comprises receiving the second input via the graphical user interface in response to selection of the first visual entity and receiving the third input comprises receiving the third input via the graphical user interface in response to selection of the third visual entity.

12. The non-transitory computer readable medium of claim 11, wherein the first visual parameter associated with the first visual entity is selected from multiple visual parameters associated with the first visual entity.

13. The non-transitory computer readable medium of claim 11, further comprising causing the first visual entity and the second visual entity to be displayed while superimposed on the dynamic illustration.

14. The non-transitory computer readable medium of claim 8, wherein the first visual entity is one of an interactive object, an emitting texture, or an oscillating texture, and the second visual entity is one of an interactive object, an emitting texture, or an oscillating texture.

15. The non-transitory computer readable medium of claim 8, wherein the fourth input graphically defines the functional relationship based on the first visual parameter of the first visual entity being an independent variable of the functional relationship and the second visual parameter of the second visual entity being a dependent variable of the functional relationship.

16. The non-transitory computer readable medium of claim 8, wherein the fourth input graphically defines the functional relationship based on the second visual parameter of the second visual entity being an independent variable of the functional relationship and the first visual parameter of the first visual entity being a dependent variable of the functional relationship.

17. The non-transitory computer readable medium of claim 8, further comprising, prior to causing the graphical representation to be displayed, receiving a set of data values, wherein the fourth input defines a quantifiable relationship with a dependent variable that is based on the set of data values.

18. A computing device configured to modify a dynamic illustration, comprising:
   a memory storing an editing mode module; and
   a processor that, when executing the editing mode module, is configured to perform the steps of:
      receiving a first input, via a graphical user interface, associated with a functional relationship between a first visual entity included in the dynamic illustration and a second visual entity included in the dynamic illustration;
      receiving a second input, via the graphical user interface, that correlates a first visual parameter associated with the first visual entity with the functional relationship;
      receiving a third input, via the graphical user interface, that correlates a second visual parameter associated with the second visual entity with the functional relationship;
      receiving a fourth input, via the graphical user interface, that modifies a quantitative definition of the functional relationship, wherein the quantitative definition includes a two-dimensional mapping curve that graphically represents a characteristic of the functional relationship between the first visual entity correlated with the first visual parameter and the second visual entity correlated with the second visual parameter and graphically modifies the two-dimensional mapping curve that graphically represents the functional relationship;
      generating a graphical representation of the first visual entity and the second visual entity based on the modified two-dimensional mapping curve; and
      displaying the graphical representation of the first visual entity and the second visual entity via the graphical user interface.

* * * * *